United States Patent [19]
Sherwood

[11] 3,961,409
[45] June 8, 1976

[54] MACHINE FOR UNLOADING MICRO-ELECTRONIC BEAM LEAD CHIPS

[75] Inventor: Theodore R. Sherwood, Sunnyvale, Calif.

[73] Assignee: Lockheed Missiles & Space Company, Inc., Sunnyvale, Calif.

[22] Filed: June 30, 1975

[21] Appl. No.: 592,126

[52] U.S. Cl. .............................. 29/235; 29/200 D
[51] Int. Cl.² ........................................ B23P 19/02
[58] Field of Search ............. 29/235, 200 D, 203 B, 29/203 H, 427

[56] References Cited
UNITED STATES PATENTS

| | | | |
|---|---|---|---|
| 3,268,991 | 8/1966 | Beinhaur | 29/427 |
| 3,791,004 | 2/1974 | Crawford et al. | 29/200 D |
| 3,859,706 | 1/1975 | Williams et al. | 29/200 D |
| 3,903,576 | 9/1975 | Stein | 29/200 D |

Primary Examiner—James L. Jones, Jr.
Attorney, Agent, or Firm—H. Donald Volk; B. G. Corber

[57] ABSTRACT

This invention is directed to a machine for unloading micro-electronic beam lead devices from a carrier. The machine removes the resilient clip, base and circuit board from the cover and the chip so that the beam lead chip is exposed and can be picked up and bonded onto a hybrid circuit substrate.

9 Claims, 5 Drawing Figures

MACHINE FOR UNLOADING MICRO-ELECTRONIC BEAM LEAD CHIPS

BACKGROUND OF THE INVENTION

With the development of integrated circuits, it has been possible to reduce the size of electronic equipment. Integrated circuits are normally manufactured by forming a plurality of them on a wafer where they can be subjected to limited testing. After these tests, the chips are separated and each of them is mounted into an integrated circuit package. The package, in turn, can be placed into a carrier where it can be tested and inspected by conventional methods. See U.S. Pat. No. 3,409,861. To make it possible to reduce the size of electronic equipment even more, attempts have been made to mount these micro-electronic chips directly to a hybrid circuit substrate instead of first mounting them in the integrated circuit package. Due to the inordinately small size of the micro-electronic chip, it is not possible to perform a number of tests on the chip prior to mounting it directly to the hybrid circuit substrate.

A micro-electronic chip carrier and testing fixture has been developed to allow the micro-electronic chip to be subjected to all necessary electrical and environmental testing. The carrier and testing fixture as shown in co-pending patent application Ser. No. 565,637 by S. A. Bonis, assigned to the same Assignee. That carrier includes a base and a printed circuit board that includes electrical conductors and a rectangular aperture for receiving the micro-electronic chip. The micro-electronic chip is mounted on the printed circuit board located on the base and a transparent cover is installed over the micro-electronic chip and retained there by a resilient metallic clip. Since the beam leads of the micro-electronic chip are made of gold deposited over platinum and are approximately 5 mils. (0.005 inches) wide and approximately 5 mils (0.005 inches) long, they are fragile. Any sliding movement of the chip relative to the printed circuit board could damage or break the leads. Thus, any sliding movement of the micro-electronic chip relative to the base or the cover must be avoided.

SUMMARY OF THE INVENTION

This invention is directed to a machine for unloading microelectronic beam lead chips. The beam lead chip carrier assembly is placed upside down on the machine and is located by guide pins and held in position by retainer springs. The transparent cover and the chip contact the vacuum chuck and are held there by a dual vacuum, one retaining the cover, the other retaining the chip through the cover aperture. A carriage that includes an upper finger and a pair of expanders engages and spreads the retainer clip to remove it from the carrier. The carrier and the substrate are then removed by an ejection mechanism, leaving the beam lead chip exposed and ready for removal from the transparent plate.

DESCRIPTION OF THE PREFERRED EMBODIMENT

Figure 1:
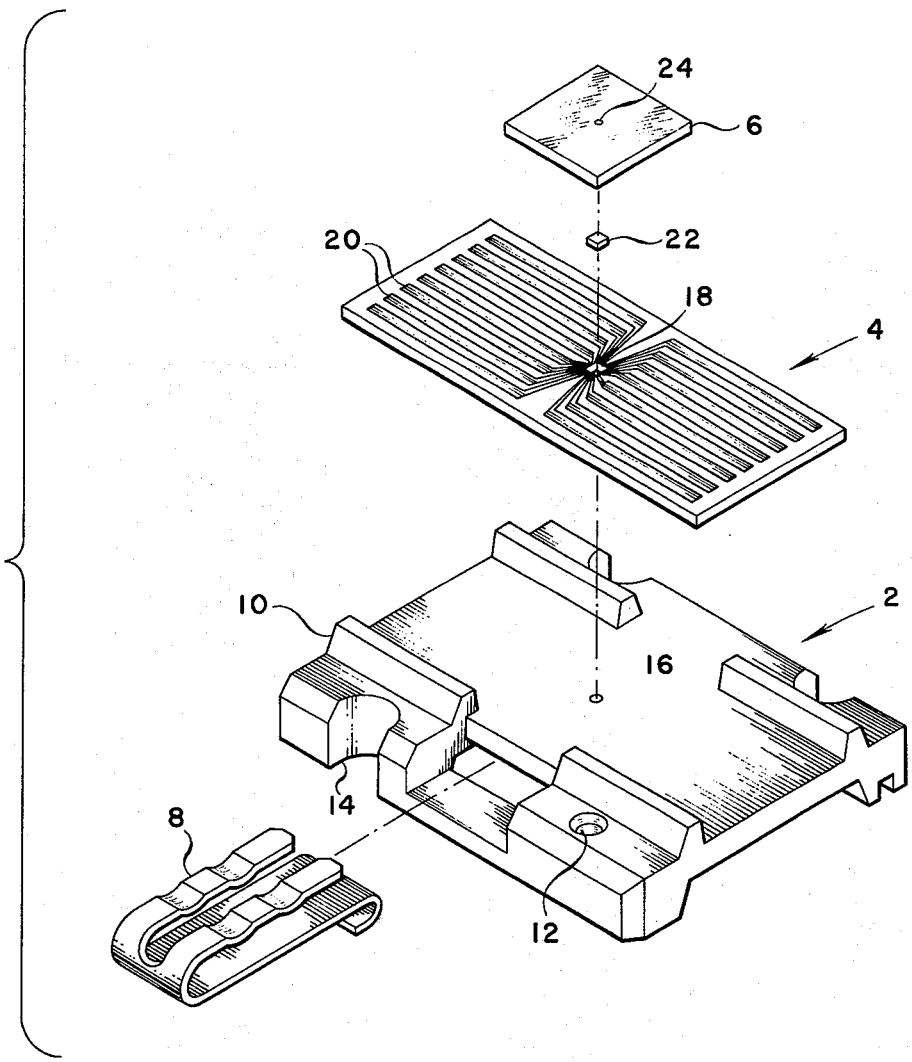
FIG. 1 is an enlarged exploded view of the micro-electronic chip carrier.

In the drawings, the same reference numbers are used throughout several views to designate the same or similar components. Referring first to FIG. 1, there is shown an exploded perspective view of the typical carrier to be unloaded by the preferred embodiment of this invention. The carrier includes a carrier base 2, a printed circuit board 4, a cover 6 and a resilient clip 8. The beam lead chip 22 is placed on the circuit board 4, and the cover 6 is placed over the chip and is held securely in position by resilient clip 8. The carrier base 2 also contains a plurality of protruding walls 10, ports 12, recesses 14 and the like which may be used to position the base in automatic carrier equipment, testing equipment and in the unloading machine of this invention.

Carrier base 2 may also include a centrally located orifice or passageway 16 extending therethrough. A rectangular aperture 18 in circuit board 4 is aligned with orifice 16 and is shaped and sized to receive and hold the beam lead chip in the desired position. A plurality of electrically conductive leads or paths 20 on circuit board 4 extend to a location adjacent to rectangular aperture 18 and are arranged to contact the beam leads on the chip to be carried and tested. Cover 6 includes orifice 24 aligned with the beam lead chip 22.

Figure 2:
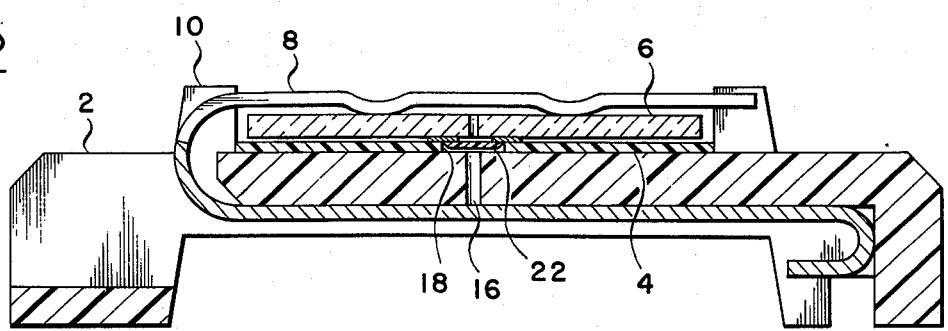
FIG. 2 is a sectional view of the carrier illustrated in FIG. 1 showing the details of the resilient clip.

FIG. 2 illustrates how the circuit board 4 cooperates with the tapered sides of the beam lead chip 22 to maintain alignment and electrical contact between the beam leads of the chip and the electrical leads 20 formed on the circuit board. Resilient clip 8 is installed with the cane-shaped leg under the base 2 and the corrugated leg in intimate contact with cover 6.

Figure 3:
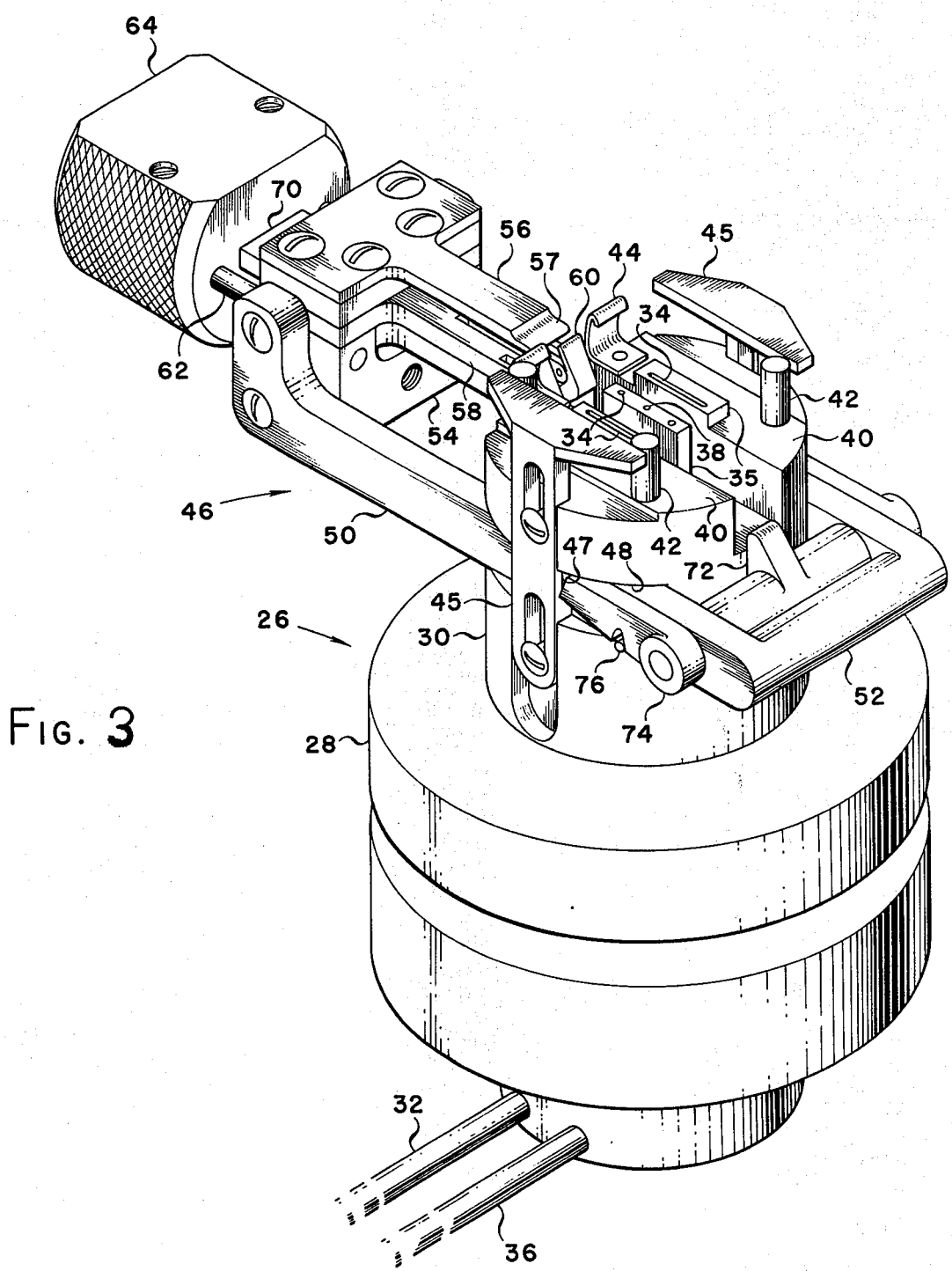
FIG. 3 is an enlarged perspective view of the preferred embodiment of the invention.
Figure 4:
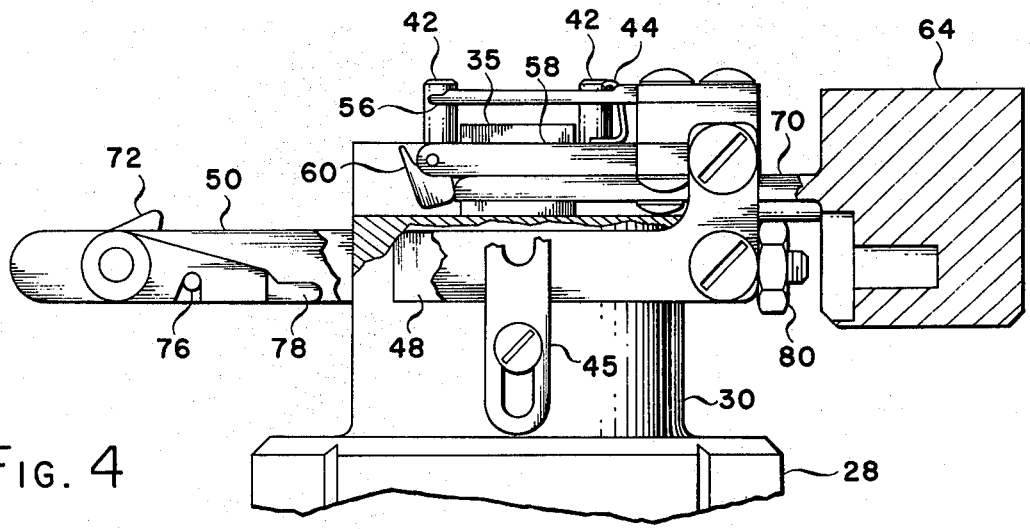
FIG. 4 is a side view of the preferred embodiment of the invention, portions being broken away to show the details of the carriage.
Figure 5:
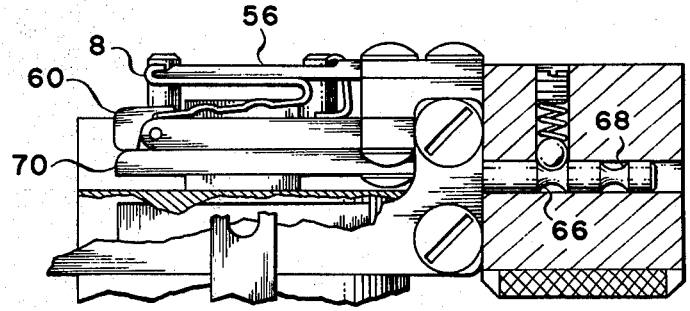
FIG. 5 is a partial side view of the machine illustrated in FIG. 4 showing the carriage in a different position, portions being broken away to show internal details.

Referring to FIGS. 3, 4 and 5, the unloading machine of this invention includes a base 26. The base 26 includes a large substantially cylindrical bottom portion 28 and a small substantially cylindrical upper portion 30. A cover holding vacuum conduit 32 is connected to eight cover vacuum orifices 34 on the top support lands 35 of base 26 by ducts, not shown. The cover vacuum orifices 34 and top support lands 35 form a vacuum chuck for retaining the cover 6 on the unloading machine. Similarly, the chip holding vacuum conduit 36 is connected to the single chip vacuum orifice 38 on the middle top support land of base 26 that form a vacuum check for retaining the beam lead chip 22 on the unloading machine.

Recessed below lands 35 are planar surfaces 40. Three locator pins 42 protrude from planar surfaces 40 and cooperate with recesses 14 of the carrier base 2 to align the carrier base 2 in the unloading machine. Retaining springs 44 also protrude from planar surfaces 40. The retaining springs engage the edge of the carrier base 2 to ensure that the carrier base 2 does not move during the unloading operation.

A pair of T-shaped ejectors 45 are slideably mounted on the flattened side of the cylindrical upper portion 30 of base 26. The ejectors include a lifter slot 47.

Insert carriage 46 is slidably mounted in slots 48 of the upper portion 30 of base 26. The insert carriage includes a pair of L-shaped arms 50 that are held together by an outer tie bar 52 and an inner tie bar 54.

An upper finger 56 is rigidly mounted to the top of inner tie bar 54 and includes a stepped engaging surface 57. A bifurcated lower finger 58 is rigidly affixed to the inner tie bar 54, projects parallel to upper finger 56, and moves in unison with it. A pair of expanders 60 are rotatably mounted on the bifurcated ends of lower fingers 58.

a pair of support shafts 62 protrude outwardly from the inner tie bar 54. An actuator 64 is slideably mounted on support shafts and is locked in the two extreme positions by inner detent 66 and outer detent 68. A bifurcated pusher 70 is rigidly attached to actuator 64 and projects below bifurcated lower finger 58 for rotating expanders 60.

An integral lift cam 72 and lifter 74 is mounted inboard of the outer tie bar 52 of carriage 46. A dowel pin 76 is mounted on each arm 50 for supporting the lifter 74. A key 78 protrudes from lifter 74 and cooperates with lifter slot 47 on ejector 45 to lift lifter 74 and eject the carrier base 2.

In operation, the beam lead chip assembly is inverted from the position shown in FIG. 2, and slid onto locator pins 42 until cover 6 rests upon lands 35. At the same time, retaining springs 44 resiliently contact the carrier base 2, ensuring positive location with the two opposing locator pins 42. As the cover 6 comes to rest on the lands 35, the protruding walls 10 of the carrier base 2 push the lifters 74 to their lower position. The actuator 64 is resiliently held in its outer position by outer detent 68 during the start of the operation. A vacuum is applied to vacuum conduits 32 and 36 to restrain the chip 22 and the cover 6, respectively.

In the first cycle of operation, the actuator 64 is restrained in outer detent 68. In this cycle, actuator 64, carriage 46, upper finger 56, lower finger 58 and pusher 70 are moved toward the base 26 as a unit. The penetration of the fingers 56 and 58 are controlled by means of a stop 80 contacting upper portion of base 26 so that upper finger 56 fully engages the hooked end of resilient clip 8.

In the second cycle of operation, carriage 46 is stopped from moving by stop 80, the actuator 64 overrides the outer detent 68, and pusher 70 with actuator 64 continue their movement toward the base 26. The pusher 70 moves forward relative to lower finger 58 allowing the pusher 70 to contact expanders 60 and pivot them. This causes the expanders 60 to engage the ends of resilient clip 8 thus springing it and holding it out of contact with the cover 6. The actuator 64 seats into inner detent 66, thus effectively locking the pusher 70 relative to lower finger 58.

In the third cycle, the actuator 64, carriage 46, upper finger 56, lower finger 48 and pusher 70 are moved away as a single entity from the base 26 carrying clip 8 with them. As the movement continues, caming surface of lift cam 72 contacts base 26, pivoting lift cam 72 and lifters 74. Key 78, at this time, is in lifter slot 47 on ejector 45. The pivoting of lift cam 72 and lifters 74 raises lifters 74 and ejects the carrier base 2 and the circuit board 4. At the same time, a slight pull on actuator 64 will overcome the resilient force of inner detent 68, allowing actuator 64 and pusher 70 to move relative to lower finger 58. The resiliency of resilient clip 8 and gravity then pivot expanders 60 back to their original starting position. Actuator 64 engages into outer detent 68.

The vacuum is retained on vacuum conduit 32 to retain cover 6 on the support lands 35. Vacuum conduit 36 is coupled to a conventional vacuum probe so that the vacuum is removed from vacuum conduit 36 and vacuum orifice 38 when the vacuum is applied to the probe, thus freeing the beam lead chip to be removed by the vacuum probe.

The vacuum can then be removed from vacuum conduit 32 so that the cover 6 can be removed by conventional means. The resilient clip 8 then can be removed.

It may be seen that there has been described herein a novel and improved beam lead chip unloading machine. While the description herein is presently considered to be preferred, it is contemplated that further modifications and improvements within the purview of those skilled in the art may be made herein.

The following claims are intended to cover all variations and modifications as fall within the true spirit and scope of the invention.

What is claimed is:

1. A machine for unloading micro-electronic beam lead chips from a carrier that includes a carrier base, a cover and a two-legged resilient clip, said machine comprising:

a machine base including a means for receiving and retaining a beam lead chip carrier, said receiving and retaining means aligning the carrier to the machine base means, a carriage moveable in said machine base, said carriage including an actuator means, a first finger means, a second finger means and a pusher means, said first finger means adapted for engaging one leg of said resilient clip, said second finger means including at least one rotatable expander on the end thereof, said pusher means cooperating with said rotatable expander to rotate said expander to engage the second leg of said resilient clip to thereby disengage said resilient clip from the rest of said carrier, and means for locking said pusher relative to said second finger so that said resilient means can be removed from the rest of said carrier.

2. The machine of claim 1 wherein said actuator means and said pusher means are slidable relative to said first finger means and said second finger means, and wherein said locking means comprises at least one detent.

3. The machine of claim 2 wherein said receiving and retaining means includes a plurality of locator pins and at least one retaining spring.

4. The machine of claim 3 including means for ejecting the carrier base from the said machine.

5. The machine of claim 4 wherein said ejecting means comprises a pair of T-shaped ejectors slidably mounted on said machine base.

6. The machine of claim 5 including an integral lift cam and lifter mounted on said carriage, said lift cam contacting said base at one position of said carriage whereby the said lifter coacts with said ejector means to eject the said carrier base from said machine.

7. The machine of claim 6 including first means for retaining said carrier cover on said machine during the removal of the said resilient clip and the said carrier base.

8. The machine of claim 7 including a second retaining means for retaining said beam lead chip on said carrier cover during the removal of the said resilient clip and the said carrier base.

9. The machine of claim 8 wherein said finger and second retaining means comprise first and second vacuum chucks, respectively.

* * * * *

UNITED STATES PATENT OFFICE
CERTIFICATE OF CORRECTION

Patent No. 3,961,409                    Dated    June 8, 1976

Inventor(s)  Theodore R. Sherwood

It is certified that error appears in the above-identified patent and that said Letters Patent are hereby corrected as shown below:

Column 1, line 4, after the heading, insert the following paragraph:

--The invention herein described was made in the course of or under a contract or subcontract thereunder, with the Navy Department.--

Signed and Sealed this

Twenty-eighth Day of September 1976

[SEAL]

Attest:

RUTH C. MASON
*Attesting Officer*

C. MARSHALL DANN
*Commissioner of Patents and Trademarks*